United States Patent
Wu et al.

(10) Patent No.: US 7,265,041 B2
(45) Date of Patent: Sep. 4, 2007

(54) GATE LAYOUTS FOR TRANSISTORS

(75) Inventors: Schyi-yi Wu, Mesa, AZ (US);
Ji-hyoung Yoo, Cupertino, CA (US)

(73) Assignee: Micrel, Inc., San Jose, CA (US)

( * ) Notice: Subject to any disclaimer, the term of this patent is extended or adjusted under 35 U.S.C. 154(b) by 81 days.

(21) Appl. No.: 11/311,995

(22) Filed: Dec. 19, 2005

(65) Prior Publication Data

US 2007/0138549 A1 Jun. 21, 2007

(51) Int. Cl.
*H01L 29/74* (2006.01)
*H01L 31/111* (2006.01)
*H01L 27/082* (2006.01)
*H01L 27/102* (2006.01)
*H01L 29/70* (2006.01)
*H01L 31/11* (2006.01)

(52) U.S. Cl. .................. 438/587; 438/128; 438/197
(58) Field of Classification Search ........ 438/128–129, 438/587–599, 197–211
See application file for complete search history.

(56) References Cited

U.S. PATENT DOCUMENTS

| | | | |
|---|---|---|---|
| 6,867,083 B2 * | 3/2005 | Imam et al. ................. | 438/212 |
| 7,064,051 B2 * | 6/2006 | Lee et al. ................... | 438/587 |
| 7,094,674 B2 * | 8/2006 | Graf et al. ................... | 438/598 |
| 7,192,857 B1 * | 3/2007 | Hopper et al. .............. | 438/587 |
| 7,211,478 B1 * | 5/2007 | Pelham et al. .............. | 438/197 |

* cited by examiner

*Primary Examiner*—Cuong Nguyen
(74) *Attorney, Agent, or Firm*—Sawyer Law Group LLP (57) ABSTRACT

A transistor and a method of fabricating the transistor are provided. The transistor includes a semiconductor material comprising drain regions and source regions formed in alternating rows or columns. The transistor also includes polysilicon chains overlaying the top of the semiconductor material, disconnected from and substantially parallel to one another, and separating the drain regions from the source regions. The method includes providing a semiconductor material, growing a first insulating layer on top of the semiconductor material, depositing a polysilicon layer on top of the first insulating layer, defining a plurality of chains in the polysilicon layer, the plurality of chains being disconnected from and substantially parallel to one another, and forming a plurality of drain regions and a plurality of source regions in the semiconductor material in alternating rows or columns. The plurality of chains separates the plurality of drain regions from the plurality of source regions.

12 Claims, 6 Drawing Sheets

GATE LAYOUTS FOR TRANSISTORS

FIELD OF THE INVENTION

The present invention relates generally to transistors. More particularly, the present invention is directed to improved gate layouts for transistors.

BACKGROUND OF THE INVENTION

Low on-resistance ($R_{ON}$) metal-oxide semiconductor (MOS) transistors are desirable for their low power loss and ability to conduct high currents. A cellular array of vertical double-diffused MOS (VDMOS) transistors can be made to have a very low [$R_{ON}$*Area] product ($\Omega$ mils$^2$). This is partly because no top surface area is used to form drain regions, which allows a high density of transistor to be connected in parallel and a source metal layer to substantially cover the top surface of the transistor structure. The large source metal width provides a low metal resistance, while the high density of the transistors connected in parallel provides a very low transistor on-resistance between the source and drain regions.

For integrated circuit (IC) applications, however, forming N-channel and P-channel VDMOS transistors in the same substrate is impractical. Additionally, it may be desirable to connect the body of a transistor to a separate biasing voltage, which is not possible with cellular VDMOS transistors. Other limitations also exist with VDMOS transistors when formed in an IC, such as a high drain-to-substrate capacitance and a large overhead associated with bringing the drain up to the top surface of the substrate to interconnect the VDMOS transistors with other circuitry on the same substrate. Moreover, a VDMOS transistor formed on a discrete device may require a large overhead to terminate the outer edges, contain a large parasitic junction gate field-effect transistor (JFET), and have a high epitaxial drain resistance.

Problems are also associated with forming P-channel discrete VDMOS transistors. Specifically, it is tough to fabricate a low resistivity P+ substrate, there is a need for a thicker P epitaxial layer to allow for P autodoping by the substrate, and it is difficult to control the resistivity of the P epitaxial layer.

In situations where the drawbacks of a VDMOS transistor prevent its use, lateral MOS transistors have been used. U.S. Pat. No. 5,355,008, entitled "Diamond Shaped Gate Mesh for Cellular MOS Transistor Array," which is hereby incorporated in its entirety for all purposes, discloses a lateral transistor that has a [$R_{ON}$*Area] product comparable to that of vertical transistors. The lateral transistor disclosed employs a polysilicon gate mesh to separate the source and drain regions of the transistor.

Although the gate mesh lateral transistor is ideal under circumstances where a vertical transistor is impractical, it can be even better. For instance, since currents do not flow through the intersections in the gate mesh between two source regions or between two drain regions, those areas of the polysilicon could be put to better use. In addition, as a result of the proximity effect of masking, the length of the channels between a source region and a drain region may be larger than necessary. Further, when the contact of a source or drain region is defective, that region is no longer effective because the region is completely enclosed by the polysilicon gate mesh.

Accordingly, there is a need for a lateral transistor that better utilizes the intersections in the polysilicon gate mesh between two source/drain regions, improves the length of channels between source regions and drain regions, and is capable of using a region even after the contact for the region becomes inoperable without sacrificing the advantages achieved by the gate mesh lateral transistor. The present invention addresses such a need.

SUMMARY OF THE INVENTION

A transistor is disclosed. The transistor includes a semiconductor material having a top surface and comprising a plurality of drain regions and a plurality of source regions. The plurality of drain regions and the plurality of source regions are formed in alternating rows or columns. The transistor also includes a plurality of polysilicon chains overlaying and insulated from the top surface of the semiconductor material and separating the plurality of drain regions from the plurality of source regions. The plurality of polysilicon chains are disconnected from and substantially parallel to one another.

A method of fabricating a transistor is also provided. The method includes providing a semiconductor material having a top surface, growing a first insulating layer on the top surface of the semiconductor material, depositing a polysilicon layer on top of the first insulating layer, the first insulating layer insulating the polysilicon layer from the semiconductor material, defining a plurality of chains in the polysilicon layer, the plurality of chains being disconnected from and substantially parallel to one another, and forming a plurality of drain regions and a plurality of source regions in the semiconductor material, the plurality of drain regions and the plurality of source regions being formed in alternating rows or columns. The plurality of chains separates the plurality of drain regions from the plurality of source regions.

DETAILED DESCRIPTION

The present invention relates generally to transistors and more particularly to improved gate layouts for transistors. The following description is presented to enable one of ordinary skill in the art to make and use the invention and is provided in the context of a patent application and its requirements. Various modifications to the preferred implementations and the generic principles and features described herein will be readily apparent to those skilled in the art. Thus, the present invention is not intended to be limited to the implementations shown, but is to be accorded the widest scope consistent with the principles and features described herein.

Figure 1:
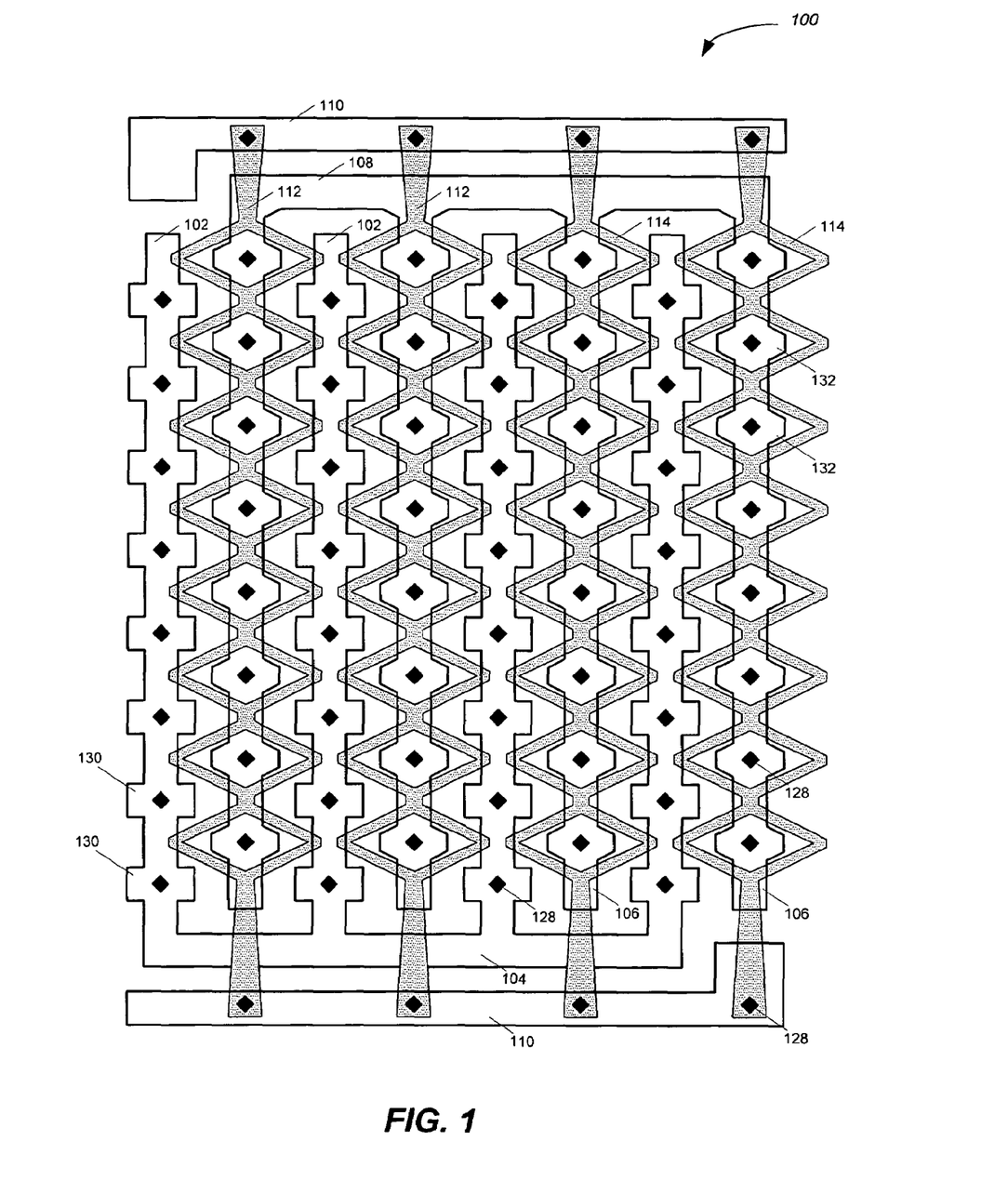
FIG. 1 is a top-down view of a transistor with open source regions and polysilicon chains having diamond-shaped links according to an embodiment of the invention.

FIG. 1 depicts a top-down view of a transistor 100 according to an embodiment of the invention. Transistor 100 comprises source metal strips 102 connected together by a source metal plate 104, drain metal strips 106 connected together by a drain metal plate 108, gate metal plates 110, and polysilicon chains 112 made up of links 114. In an actual top view of transistor 100, the metal portions would obscure any underlying portions. However, in FIG. 1, the metal portions are made transparent to better illustrate the structure of transistor 100.

In the embodiment of FIG. 1, source metal strips 102 and drain metal strips 106 are arranged in alternating and substantially parallel columns (or rows, depending on perspective) to optimize the area used, though it is not required that source metal strips 102 and drain metal strips 106 be laid out as such. Additionally, transistor 100 is shown with only four source metal strips 102 and four drain metal strips 106 for simplicity purposes. Other embodiments of transistor 100 may have more or less source metal strips 102 and/or drain metal strips 106 as the size of a transistor array can be selected to achieve virtually any on-resistance ($R_{ON}$) and current handling capacity.

Figure 2:
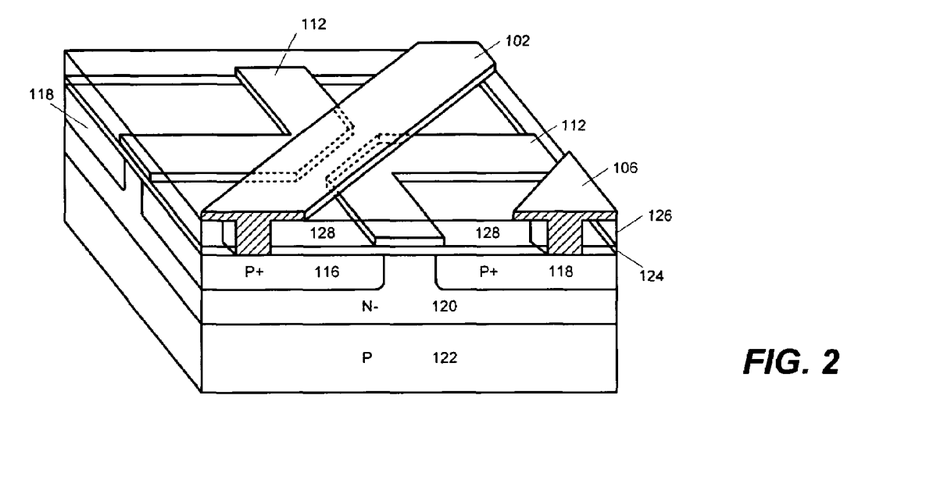
FIG. 2 illustrates a perspective view in cross-section of a portion of the transistor structure of FIG. 1.

Transistor 100 will be described in conjunction with FIG. 2, which is a perspective cross-sectional view of a portion of transistor 100 in FIG. 1. Under each source metal strip 102 and drain metal strip 106 is a plurality of source regions 116 and a plurality of drain regions 118. For purposes of clarity, each source metal strip 102 and each drain metal strip 106 is illustrated in FIG. 1 with tabs 130 and 132 to show the locations of source regions 116 and drain regions 118. Source metal strip 102 and drain metal strip 106 are illustrated in FIG. 2 without tabs 130 and 132 for simplicity and because source metal strips 102 and drain metal strips 106 need not include tabs 130 and 132. Moreover, the shape of tabs 130 and 132 are not limited to those shown in FIG. 1.

Although each source metal strip 102 and drain metal strip 106 is shown in FIG. 1 as having eight source regions and eight drain regions, respectively, underneath, in other embodiments of the invention, each metal strip may have more or less regions. In addition, each metal strip need not overlie the same number of regions.

In FIG. 1, links 114 in polysilicon chains 112 enclose drain regions 118 and at least one of the polysilicon chains 112 spans one column of drain regions 118 and two columns of source regions 116. However, in another implementation of the invention, links 114 in polysilicon chains 112 enclose source regions 116 rather than drain regions 118 and at least one of the polysilicon chains 112 spans one column of source regions 116 and two columns of drain regions 118 rather than the other way around. Additionally, although each link 114 is shown to approximate a diamond shape, link 114 can approximate other shapes, such as circular, elliptical, propeller, rectangular, V, C, U, etc. Moreover, links 114 need not all be of the same shape and size.

With open source regions 116, the gate width (W) of transistor 100 is increased. This further reduces the on-resistance ($R_{ON}$) without increasing the overall area of transistor 100. Thus, the layout of transistor 100 results in an even lower [$R_{ON}$*Area] product ($\Omega$ mils$^2$).

In addition, by opening up the source and/or drain regions, current can flow between source and drain regions as well as source and source regions and/or drain and drain regions. The channel length between source regions and drain regions are also improved because the mask needed to define polysilicon chains 112 should have less proximity effect than the mask needed to define a polysilicon gate mesh.

Figure 3:
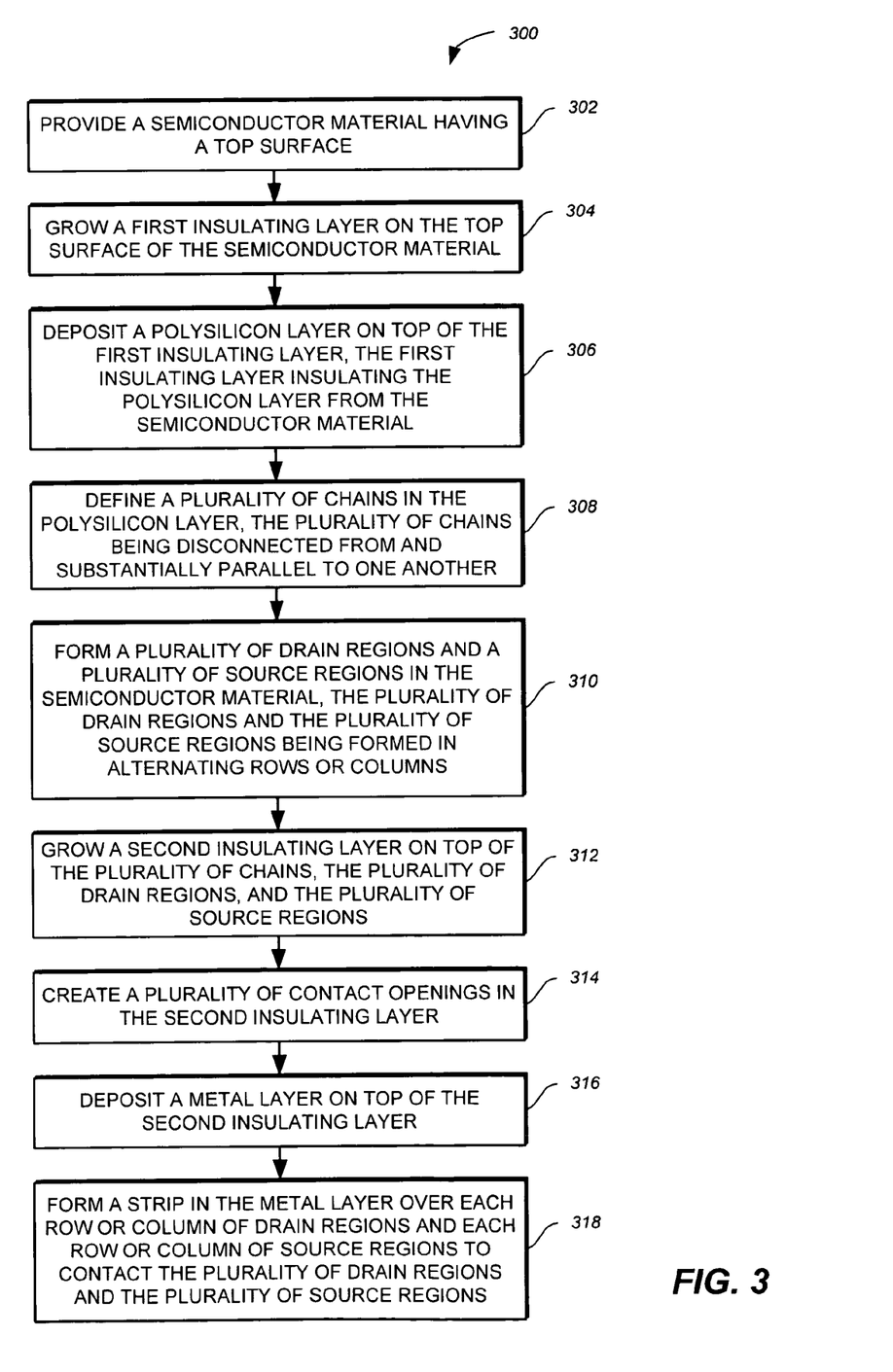
FIG. 3 depicts a process flow of a method for fabricating a transistor according to one implementation of the invention.

Illustrated in FIG. 3 is a process 300 for fabricating a transistor according to an aspect of the invention. For purposes of clarity, FIG. 3 will be described in conjunction with FIGS. 1 and 2. At 302, a semiconductor material having a top surface is provided. In the embodiment of FIG. 2, the semiconductor material is an epitaxial layer 120, which is on top of a substrate 122. Substrate 122 is a P-type substrate while epitaxial layer 120 is an N-type epitaxial layer. A similar P-channel discrete device can be built in an N-type substrate in other implementations. The resistivity of substrate 122 and epitaxial layer 120 may be 6 $\Omega$ cm and 0.8 $\Omega$ cm, respectively.

Instead of forming the transistor in N– epitaxial layer 120, P-channel transistors may be formed in N-well regions created in P-type substrate 122. N-channel transistors can then be formed directly in P-type substrate 122 to fabricate a complementary metal-oxide semiconductor (CMOS) device. Other implementations of the invention may include an N-type substrate. In those implementations, the epitaxial layer may be eliminated and the transistors may be built directly in the N-type substrate or formed in doped P-wells. If desired, an N+ buried layer (not shown) may be formed at the interface of N– epitaxial layer 120 and P-type substrate 122 to reduce the beta of any parasitic PNP bipolar transistor formed.

At 304, a first insulating layer 124 is grown on the top surface of the semiconductor material 120. First insulating layer 124 may be a thin layer (e.g., 500 Å) of gate oxide. A polysilicon layer is then deposited on top of the first insulating layer 124 at 306, the first insulating layer 124 insulating the polysilicon layer from the semiconductor material 120. The thickness of the polysilicon layer is 5,000 Å in one embodiment. At 308, a plurality of chains 112 is defined in the polysilicon layer, the plurality of chains 112 being disconnected from and substantially parallel to one another. Polysilicon chains 112 may be defined using conventional photolithographic and dry etching techniques.

The polysilicon may be predoped or doped in a later doping step to be made conductive. In one implementation, the polysilicon is doped heavily N-type. At 310, a plurality of drain regions 118 and a plurality of source regions 116 are formed in the semiconductor material 120. The plurality of drain regions 118 and the plurality of source regions 116 are formed in alternating columns and the plurality of polysilicon chains 112 acts as gates to separate the plurality of drain regions 118 from the plurality of source regions 116. Polysilicon chains 112 provides a conduit or channel through which current can pass between drains regions 118 and source regions 116 when proper voltage is applied to transistor 100.

In the embodiment of FIG. 2, a P doping mask is used in a conventional photolithographic process to expose polysilicon chains 112 and the surface of epitaxial layer 120 within the diamond shaped openings in links 114. P dopants, such as boron ions, are then implanted into the exposed surface to form source regions 116 and drain regions 118. The dosage and energy used may be [$3*10^{15}$ ions/cm$^2$] and 35 keV, respectively, but will depend upon details of the particular process parameters used and the desired operating characteristics of the device.

During the doping process polysilicon chains 112 may act as a mask to self-align source regions 116 and drain regions 118 within epitaxial layer 120. This implantation may also be used to cause polysilicon chains 112 to be highly conductive if the polysilicon had not been previously doped. The implanted boron ions may be activated and diffused in a subsequent heating step. An N+ ring (not shown) may also be used to form a guard ring (i.e., channel stop) around the periphery of the columns of source regions 116 and drain regions 118. If desired, gate edge spacers may also be formed prior to the P doping process to prevent the P doping from subsequently diffusing too far under polysilicon chains 112.

Process 300 may include an optional step of forming a salicide (i.e., self-aligned silicide) on a surface of the plurality of polysilicon chains 112, the plurality of drain regions 118, and the plurality of source regions 116 (not shown). This optional step reduces the resistivity at the surface of polysilicon chains 112, drain regions 118, and source regions 116. The salicide may be formed by depositing or growing a layer of oxide over the surface of the wafer, etching back the layer of oxide to expose the surface of source regions 116 and drain regions 118 while leaving a narrow oxide portion remaining around the edges of polysilicon chains 112, then sputtering or evaporating a thin layer of a refractory metal (e.g., Mo, Ta, Ti, W, etc.) or a near-noble metal (e.g., Co, Ni, Pd, Pt, etc.) over the exposed silicon and polysilicon regions and heating the wafer to react the metal with the silicon and polysilicon. Residual metal overlaying any oxide can be rinsed away using conventional etching techniques. The resistivity of the salicide may be approximately 5 Ω/square, while that of the underlying P+ regions may be approximately 100 Ω/square. If desired, gate polycide may not be formed concurrently with the formation of the salicide in the source regions 116 and drain regions 118 by forming an oxide on top of polysilicon chains 112.

At 312, a second insulating layer 126 is grown on top of the plurality of chains 112, the plurality of drains regions 118, and the plurality of source regions 116. In one embodiment, second insulating layer 126 is an oxide that is approximately one micron thick. A plurality of contact openings 128 are then created in the second insulating layer 126 at 314. Contact openings 128 may be created by patterning and etching second insulating layer 126.

In FIG. 1, one contact opening 128, depicted as a black diamond shaped spot, is created for each source region 116, each drain region 118, and each end of polysilicon chains 112. FIG. 2 shows contact openings 128 extending down to source region 116 and drain region 118. Contact openings 128 may be used to properly bias source regions 116 and drain regions 118.

By opening source regions 116, placement of contact openings 128 are made easier. In addition, extra contact openings 128 may be created in or around source regions 116. The extra contact openings around source regions 116 may be used to contact epitaxial layer 120 to improve the ruggedness of transistor 100. Other embodiments of transistor 100 may also include more than one contact opening 128 at the end of each chain 112. Furthermore, the size, shape, and location of contact openings 128 may vary in other implementations of the invention.

A metal layer, such as a conventional aluminum or aluminum alloy layer, is deposited on top of the second insulating layer 126 at 316. At 318, a strip is formed in the metal layer over each column of drain regions 118 and each column of source regions 116 to contact the plurality of drain regions 118 and the plurality of source regions 116. The strips can be formed by patterning and etching the metal layer using conventional photolithographic and etching techniques. These metal strips then become source metal strips 102 and drain metal strips 106. Because source regions 116 are open in FIG. 1, a source region 116 can still be effective even when the contact 128 of the source region 116 fails, unlike gate mesh lateral transistors.

In one implementation, process 300 also includes a step of forming at least one gate plate 110 in the metal layer to contact one end of each of the plurality of chains 112. Transistor 100 in FIG. 1 is shown with two gate metal plates 110 contacting the ends of each of the plurality of chains 112 via contact openings 128.

Drain metal strips 106 in FIG. 1 terminate in drain metal plate 108, which is connected to a drain voltage source (not shown). Similarly, source metal strips 102 terminate in source metal plate 104, which is connected to a source voltage (not shown). As seen in FIG. 1, source metal strips 102 and source metal plate 104 can be a mirror image of drain metal strips 106 and drain metal plate 108. Gate metal plate 110 may be connected via a metal extension or a polysilicon extension to a gate voltage source (not shown).

Figure 4:
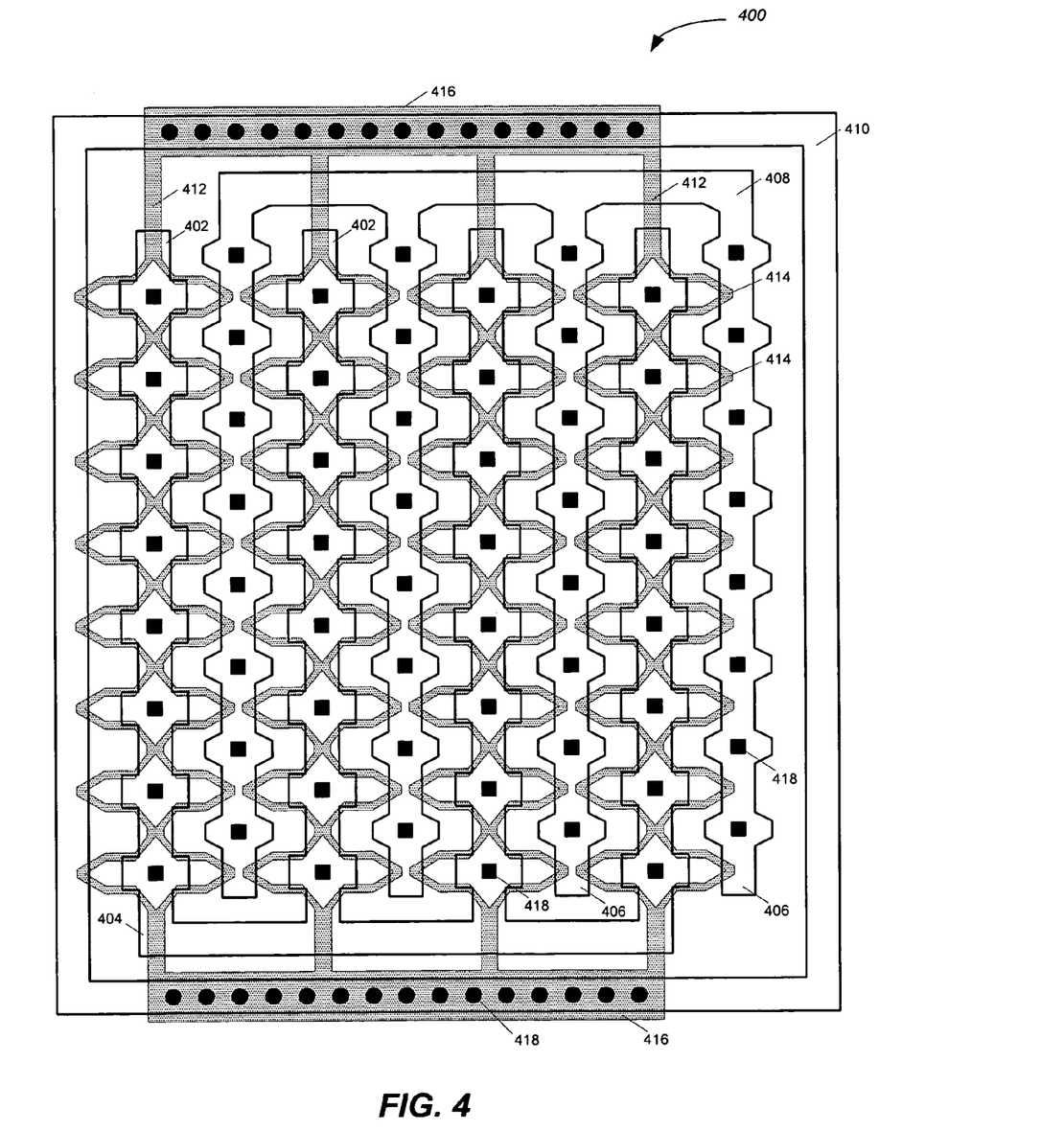
FIG. 4 shows a top-down view of a transistor with open drain regions and polysilicon chains having propeller-shaped links according to an aspect of the invention.

FIG. 4 shows a transistor 400 with source metal strips 402 terminating in a source metal plate 404, drain metal strips 406 terminating in a drain metal plate 408, and a gate metal plate 410 completely surrounding source metal strips 402, source metal plate 404, drain metal strips 406, and drain metal plate 408. Contact openings 418 contact each source metal strip 402 and each drain metal strip 406 to the source and drain regions underneath.

Transistor 400 also includes polysilicon chains 412 with links 414 and polysilicon extensions 416 connecting the ends of polysilicon chains 412. Additionally, contact openings 418 contact gate metal plate 410 to polysilicon chains 412 through polysilicon extensions 416. In the embodiment of FIG. 4, each source region under source metal strips 402 are enclosed by a link 414 in polysilicon chain 412.

Although source and drain regions are illustrated in the figures as being the same size, some transistors have drain regions that are larger than source regions. However, in the embodiment of FIG. 4, larger drain regions may no longer be needed because the drain regions under drain metal strips 406 are now open and can therefore share the load of other drain regions.

In FIG. 4, links 414 in polysilicon chains 412 approximate a propeller shape in contrast to the diamond shaped links 114 in FIG. 1. Additionally, unlike the polysilicon chains 112 in FIG. 1, polysilicon chains 412 have more than one contact to gate metal plate 410 at each end of polysilicon chain 412 as a result of the polysilicon extensions 416.

Figure 5:
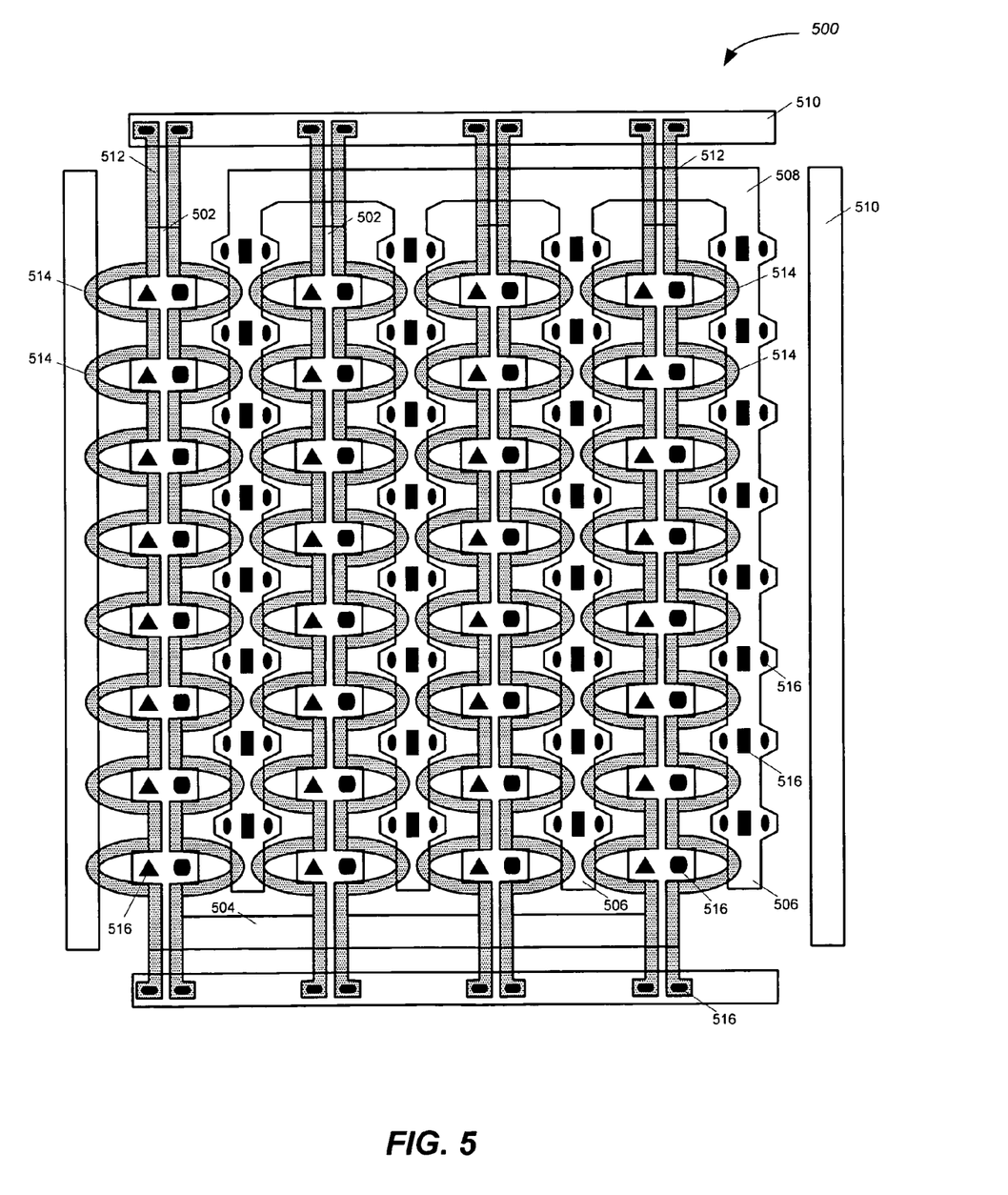
FIG. 5 illustrates a top-down view of a transistor with open source regions, open drain regions, and polysilicon chains having U-shaped links in accordance with another embodiment of the invention.

Depicted in FIG. 5 is a transistor 500 according to another aspect of the invention. Transistor 500 includes source metal strips 502, a source metal plate 504 connecting source metal strips 502, drain metal strips 506, a drain metal plate 508 connecting drain metal strips 506, gate metal plates 510, polysilicon chains 512 with links 514, and contact openings 516. In the embodiment, source regions under source metal strips 502 and drain regions under drain metal strips 506 are both open. As a result, there are twice as many polysilicon chains 512 in FIG. 5 as compared to FIGS. 1 and 4. In addition, at least two of the plurality of polysilicon chains 512 spans only one column of source regions and one column of drain regions. Links 514 in polysilicon chains 512 approximates a U-shape.

In contrast to transistors 100 and 400 in FIGS. 1 and 4, transistor 500 in FIG. 5 has multiple contact openings 516 for each source and drain region. As discussed above and shown in FIG. 5, the size, number, and location of contact openings 516 may differ from transistor to transistor. Further, some of the contact openings 516 may be used to contact the body (e.g., epitaxial layer) of a device to improve the ruggedness of the device. And although it is not shown in FIG. 5, additional contact openings may be created in links 514 of the left most polysilicon chain 512 to contact the chain to the gate metal plate 510 on the left.

The method for forming the structures illustrated in FIGS. 4 and 5 are identical to that described with respect to FIGS. 1-3, except the resulting structure will have different number of chains, different shape of links, different number, shape, size, and/or location of contact openings, and/or different number, shape, and/or location of gate metal plates. In addition, the size of links may be optimized to provide the lowest [$R_{ON}$*Area] product depending on a variety of considerations, such as the particular source/drain doping level, the size of the device, etc.

Figure 6:
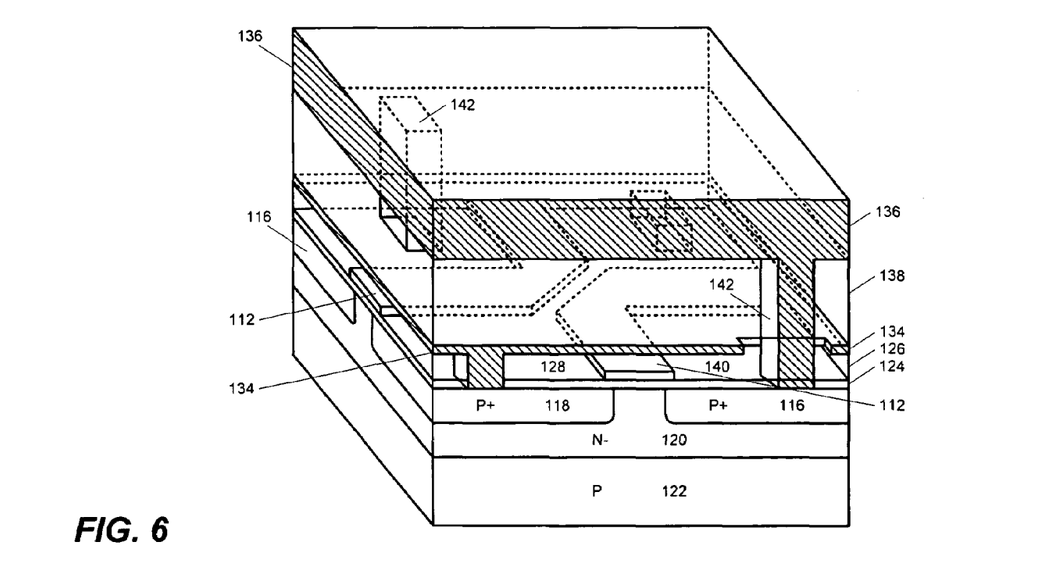
FIG. 6 depicts a perspective view in cross-section of a transistor with overlying source and drain metal layers in accordance with another implementation of the invention.

FIG. 6 illustrates another embodiment of the invention that can achieve an even lower source metal and drain metal resistance. The transistor structure of FIG. 6 includes a drain metal first layer 134 and an overlying source metal layer 136. A third insulating layer 138, such as an oxide layer or other suitable dielectric layer, insulates metal layers 134 and 136. The remaining elements are similar to the identically numbered elements in FIG. 2.

To form the structure of FIG. 6, drain metal layer 134 is deposited to overlie the entire transistor array surface, making contact to drain regions 118 and source regions 116 using contact openings 128 and 140. Drain metal layer 134 is then etched away from around vertical metal posts 142, which contact source regions 116 through contact openings 140 to electrically isolate metal posts 142 from drain metal layer 134.

Third insulating layer 138 is then grown over drain metal layer 134 and contact openings 140 are etched through the third insulating layer 138 to expose the tops of metal posts 142. Refractory metal plugs can be formed, if desired, to partially fill contact openings 140 exposing metal posts 142 prior to deposition of source metal layer 136. The refractory metal plugs may better enable source metal layer 136 to reliably contact metal posts 142. Subsequently, a thick source metal layer 136 is deposited to overlie drain metal layer 134 and third insulating layer 138 and to make contact with source regions 116 through the refractory metal plugs and metal posts 142.

The design of FIG. 6 can achieve an even lower [$R_{ON}$*Area] product than the designs shown in FIGS. 1-5 due to the low resistance of the large metal layers 134 and 136. This concept is particularly attractive for sub-micron gate technologies because very narrow metal lines do not have to be etched and double metal is often already required for other components on the same wafer. In an alternate embodiment, the source metal may be the lower layer metal and the drain metal may be the upper layer metal.

Figure 7:
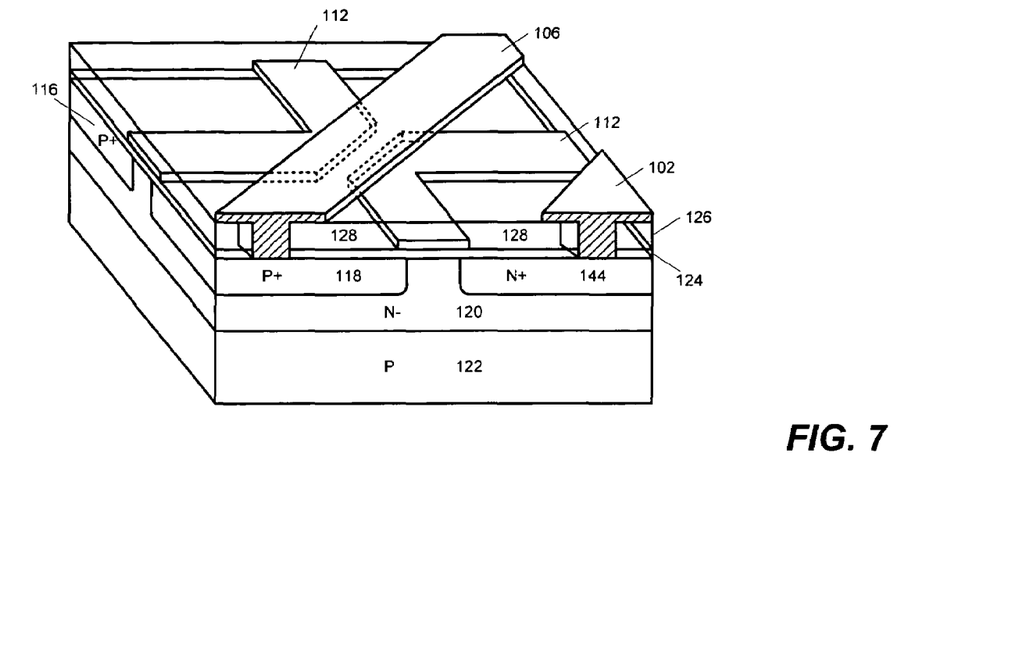
FIG. 7 shows a perspective view in cross-section of a transistor using a region as a body contact region to bias the body of the transistor in accordance with another aspect of the invention.

Shown in FIG. 7 is one way the body of a transistor may be contacted. Along with the various P+ source regions 116 and drain regions 118 shown in FIG. 2, selected regions 144 (e.g., peripheral regions) are formed to have the same conductivity type as the body of the transistor. In the case of FIG. 2, epitaxial layer 120 is of an N-type. The N+ body contact regions 144 are then connected to a reference voltage to bias the body of the transistor. If the body bias voltage is to be the source voltage, source metal strips 102 may contact regions 144. If a third voltage is to be used to bias the body, a separate metal strip or metal layer may be used to contact regions 144. Biasing epitaxial layer 120 enables the transistor to operate in a four-terminal mode. This mode is often useful to designers and is not available with VDMOS transistors.

Figure 8:
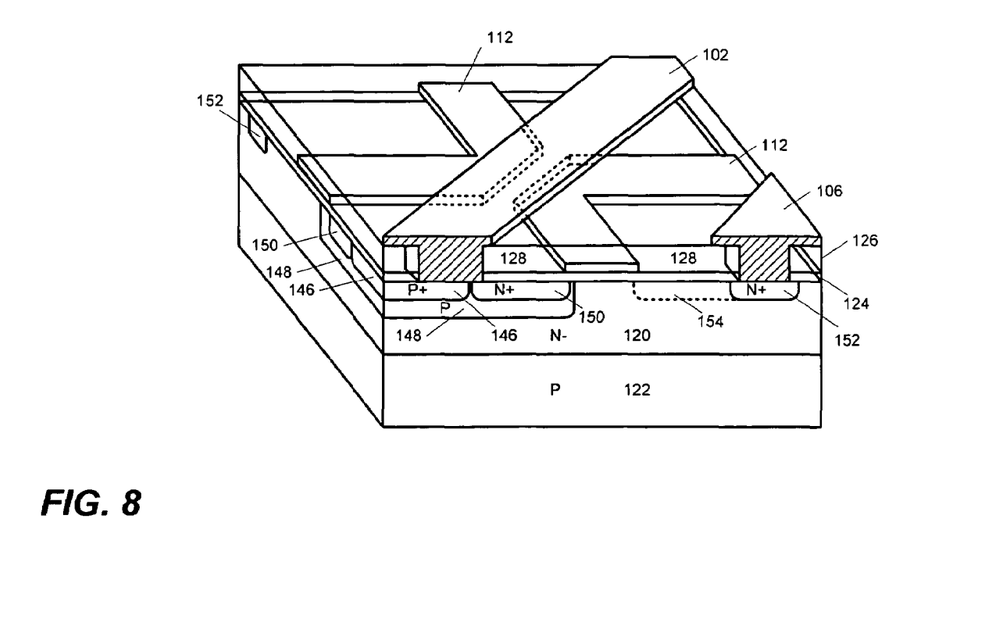
FIG. 8 is a perspective view in cross-section of a lateral double-diffused metal-oxide semiconductor (DMOS) transistor in accordance with a further embodiment of the invention.

FIG. 8 depicts a further embodiment of the invention where a lateral double-diffused metal-oxide semiconductor (DMOS) transistor is formed. The advantages of the improved gate layouts are still realized. To form the structure of FIG. 8, a P+ body contact 146 is formed in the center of the source region opening followed by a P diffusion to form a body 148 extending under polysilicon chain 112. An N doping process is then used to form an N+ source region 150 and an N+ drain region 152.

In an optional configuration, N+ drain region 152 is not separated from polysilicon chain 112, as illustrated by dashed lines 154. In another configuration, the first insulating layer 124 under the drain side of polysilicon chain 112 may be made thicker to achieve a higher breakdown voltage. The resulting lateral DMOS transistor of FIG. 8 includes a lightly doped drain (i.e., N– epitaxial layer 120) to accommodate relatively high operating voltages.

The N-channel DMOS transistor shown in FIG. 8 can be made a P-channel device by changing the conductivity types of substrate 122, epitaxial layer 120, and regions 146-154. In addition, a P-channel DMOS device may be formed in a P-well, where the P-well is formed within N– epitaxial layer 120 or within an N– substrate 122.

In the devices shown in FIGS. 1-5 and 7-8, the two-layer metal technique shown in FIG. 6 may be used to further decrease the on-resistance ($R_{ON}$) of the device. Additionally, the resulting transistors described with respect to FIGS. 1-8 have low [$R_{ON}$*Area] products that are similar to those of VDMOS transistors. One advantage of the lateral transistors described with respect to FIGS. 1-8 is that they may be easily formed in the same N– epitaxial layer 120 (or N– substrate 122) as N-channel VDMOS transistors. These lateral devices may also be formed in an integrated circuit where top surface drain contacts are needed.

By opening up the source and/or drain regions, the intersections between same-type regions are no longer wasted as current is able to flow between the regions. In addition, the channel length between source regions and drain regions are improved because the mask used to define the polysilicon chains should have less proximity effect than the mask for the polysilicon gate mesh. Moreover, since a source/drain region may no longer be completely enclosed, that region can still be effective even after a contact in that region fails.

Open source and/or open drain regions also result in increased gate width (W), which further reduces the on-resistance ($R_{ON}$), without the customary increase in area. Hence, the improved gate layouts provide an even lower [$R_{ON}$*Area] product ($\Omega$ mils$^2$). Furthermore, open drain regions result in increased drain perimeter, lower current density, and higher breakdown voltage with same total FET area.

Although a lateral P-channel device has been described with respect to the various figures, the device may also be formed as an N-channel device by reversing the conductivity types of the various regions. However, the P-channel device inherently can be operated at higher voltages than an N-channel version due to the well known snap-back phenomena in lateral N-channel devices, which limits their maximum operating voltage.

Various implementations of a transistor and methods for fabricating the transistor have been described. Nevertheless, one of ordinary skill in the art will readily recognize that various modifications may be made to the implementations, and any variations would be within the spirit and scope of the present invention. For example, the above-described process flow is described with reference to a particular ordering of process actions. However, the ordering of many of the described process actions may be changed without affecting the scope or operation of the invention. In addition, the improved transistor gate layouts disclosed herein are applicable not only to the types of lateral transistors described, but also other types of lateral transistors, such as lateral PNP transistors. Accordingly, many modifications may be made by one of ordinary skill in the art without departing from the spirit and scope of the following claims.

What is claimed is:

1. A method of fabricating a transistor, the method comprising:
   providing a semiconductor material having a top surface;
   growing a first insulating layer on the top surface of the semiconductor material;
   depositing a polysilicon layer on top of the first insulating layer, the first insulating layer insulating the polysilicon layer from the semiconductor material;
   defining a plurality of chains in the polysilicon layer, the plurality of chains being disconnected from and substantially parallel to one another; and
   forming a plurality of drain regions and a plurality of source regions in the semiconductor material, the plurality of drain regions and the plurality of source regions being formed in alternating rows or columns, wherein the plurality of chains separates the plurality of drain regions from the plurality of source regions.

2. The method of claim 1, wherein at least one of the plurality of chains spans only one row or column of source regions and two rows or columns of drain regions or only one row or column of drain regions and two rows or columns of source regions.

3. The method of claim 1, wherein at least one of the drain regions and at least one of the source regions are open.

4. The method of claim 1, wherein each of the plurality of chains comprises a plurality of links.

5. The method of claim 4, wherein at least one of the plurality of links approximates one of a diamond shape, a propeller shape, a rectangular shape, an elliptical shape, a circular shape, a rectangular shape, a V-shape, a U-shape, and a C-shape.

6. The method of claim 1, wherein the semiconductor material is a well region of a first conductivity type and the plurality of drains regions and the plurality of source regions are of a second conductivity type.

7. The method of claim 6, wherein the first conductivity type is an N-type or a P-type.

8. The method of claim 1, wherein the semiconductor material is an epitaxial layer.

9. The method of claim 1, further comprising:
   defining at least one extension in the polysilicon layer, the at least one extension being connected to one end of each of the plurality of chains.

10. The method of claim 1, further comprising:
    forming a salicide on a surface of the plurality of drain regions and the plurality of source regions.

11. The method of claim 1, further comprising:
    growing a second insulating layer on top of the plurality of chains, the plurality of drain regions, and the plurality of source regions;
    creating a plurality of contact openings in the second insulating layer;
    depositing a metal layer on top of the second insulating layer; and
    forming a strip in the metal layer over each row or column of drain regions and each row or column of source regions to contact the plurality of drain regions and the plurality of source regions.

12. The method of claim 11, further comprising:
    forming at least one gate plate in the metal layer to contact one end of each of the plurality of chains.

* * * * *